United States Patent
Hirschler et al.

(10) Patent No.: US 8,748,307 B2
(45) Date of Patent: Jun. 10, 2014

(54) USE OF A PROTECTION LAYER TO PROTECT A PASSIVATION WHILE ETCHING A WAFER

(75) Inventors: Joachim Hirschler, Villach (AT); Gudrun Stranzl, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/600,374

(22) Filed: Aug. 31, 2012

(65) Prior Publication Data
US 2014/0061873 A1    Mar. 6, 2014

(51) Int. Cl.
*H01L 21/302*    (2006.01)
(52) U.S. Cl.
USPC ........... 438/637; 438/725; 438/736; 438/738; 438/706; 257/E21.214
(58) Field of Classification Search
USPC .......... 438/637, 725–726, 706, 780, 736–738
See application file for complete search history.

(56) References Cited

U.S. PATENT DOCUMENTS

| | | | |
|---|---|---|---|
| 5,501,893 A | 3/1996 | Laermer et al. | |
| 2004/0121552 A1* | 6/2004 | Seo | 438/424 |
| 2004/0157444 A1* | 8/2004 | Chiu et al. | 438/689 |
| 2006/0205182 A1* | 9/2006 | Soejima | 438/460 |

\* cited by examiner

*Primary Examiner* — Thanh Nguyen

(57) ABSTRACT

A method for processing a wafer in accordance with various embodiments may include: forming a passivation over the wafer; forming a protection layer over at least a surface of the passivation facing away from the wafer, wherein the protection layer includes a material that is selectively etchable to a material of the passivation; forming a mask layer over at least a surface of the protection layer facing away from the wafer, wherein the mask layer includes a material that is selectively etchable to the material of the protection layer; etching the wafer using the mask layer as a mask; selectively etching the material of the mask layer to remove the mask layer from the protection layer, after etching the wafer; and selectively etching the material of the protection layer to remove the protection layer from the passivation, after selectively etching the material of the mask layer.

19 Claims, 6 Drawing Sheets

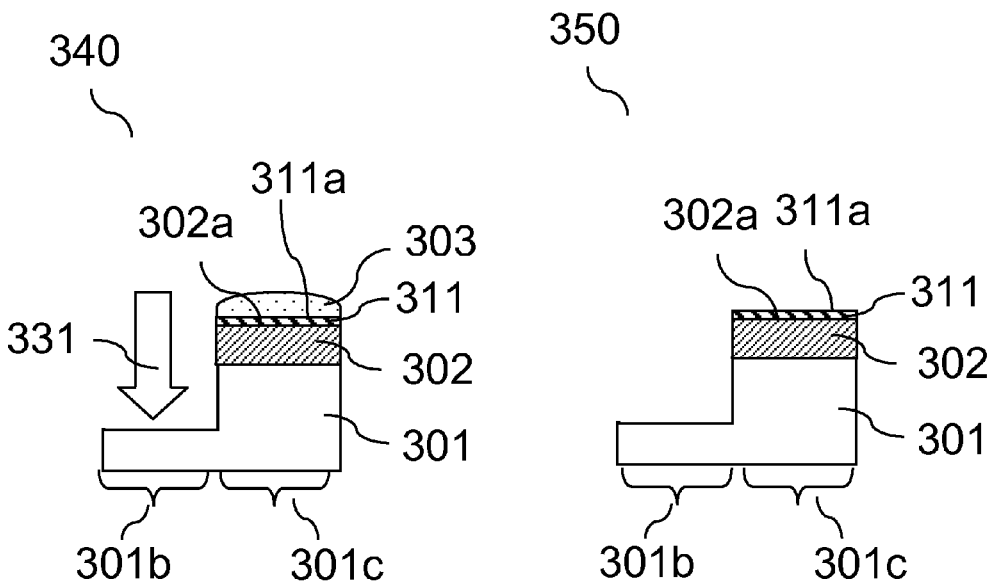
FIG. 3E
FIG. 3F
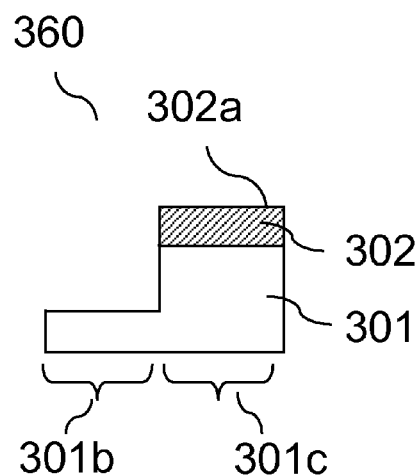
FIG. 3G

USE OF A PROTECTION LAYER TO PROTECT A PASSIVATION WHILE ETCHING A WAFER

TECHNICAL FIELD

Various embodiments relate to a method for processing a wafer and to a layer arrangement.

BACKGROUND

Modern semiconductor devices such as, for example, integrated circuit (IC) devices or chips may typically be manufactured by processing a semiconductor substrate or wafer. Processing a wafer may sometimes include etching, for example plasma etching, a side of the wafer where the semiconductor is processed, herein also referred to as the front side of the wafer. Plasma etching the front side of the wafer may, for example, be applied for dicing the wafer (e.g. using the so-called Bosch plasma etch process) or forming one or more through-hole vias (e.g. through-silicon vias (TSVs)) in the wafer.

Frequently, the front side of a wafer may be covered by a passivation or passivation layer, and an etch mask used for plasma etching the front side of the wafer may be disposed over the passivation. The etch mask may be removed again from the passivation after the plasma etching, and chip packaging material (e.g. mold compound) may, for example, be disposed over the passivation to form a chip package. Adhesion of the chip package to the chip may be dependent on the surface of the passivation, which may form the interface to the package.

SUMMARY

A method for processing a wafer in accordance with various embodiments may include: forming a passivation over the wafer; forming a protection layer over at least a surface of the passivation facing away from the wafer, wherein the protection layer includes a material that is selectively etchable to a material of the passivation; forming a mask layer over at least a surface of the protection layer facing away from the wafer, wherein the mask layer includes a material that is selectively etchable to the material of the protection layer; etching the wafer using the mask layer as a mask; selectively etching the material of the mask layer to remove the mask layer from the protection layer, after etching the wafer; and selectively etching the material of the protection layer to remove the protection layer from the passivation, after selectively etching the material of the mask layer.

A layer arrangement in accordance with various embodiments may include: a wafer; a passivation disposed over the wafer; a protection layer disposed over at least a surface of the passivation facing away from the wafer; and a mask layer disposed over at least a surface of the protection layer facing away from the wafer, wherein the protection layer includes a material that is selectively etchable to a material of the passivation, and wherein the mask layer includes a material that is selectively etchable to the material of the protection layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3A to FIG. 3G show various views illustrating a method for processing a wafer according to various embodiments;

DESCRIPTION

Figure 1A:
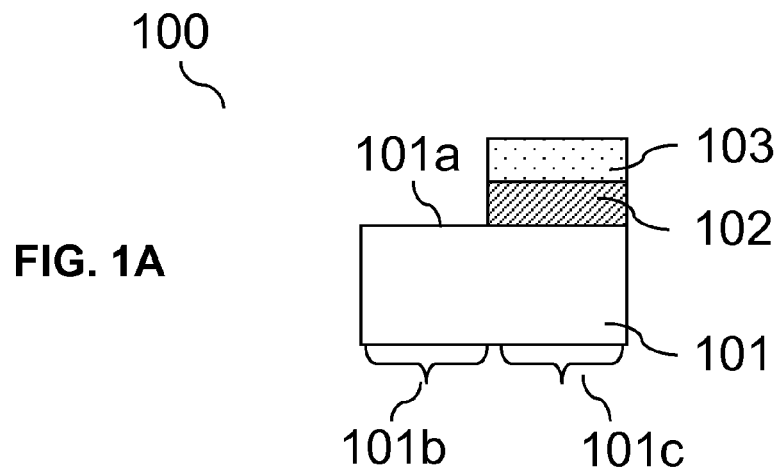
FIG. 1A to FIG. 1C show various views illustrating a conventional plasma etch process.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "front side" as used herein may refer to a side of the wafer where the semiconductor is processed.

Modern semiconductor devices such as, for example, integrated circuit (IC) devices or chips may typically be manufactured by processing a semiconductor substrate or wafer. Processing a wafer may sometimes include etching, for example plasma etching, a side of the wafer where the semiconductor is processed, herein also referred to as the front side of the wafer. Plasma etching the front side of the wafer may, for example, be applied for dicing the wafer (e.g. using the so-called Bosch plasma etch process) or forming one or more through-hole vias (e.g. through-silicon vias (TSVs)) in the wafer.

Frequently, the front side of a wafer may be covered by a passivation or passivation layer, and an etch mask used for plasma etching the front side of the wafer may be disposed over the passivation. The etch mask may be removed again from the passivation after the plasma etching, and chip packaging material (e.g. mold compound) may, for example, be disposed over the passivation to form a chip package. Adhesion of the chip package to the chip may be dependent on the surface of the passivation, which may form the interface to the package.

For example, a decrease in the quality of the surface of the passivation (or, of the interface) may cause reliability issues such as, for example, delamination.

Conventional plasma etch processes used for etching the wafer (for example, for dicing the wafer) may damage the surface of the passivation. For example, the removal of the etch mask from the passivation after the plasma etching may lead to an eroded surface of the passivation, as is illustrated below in FIG. 1A to FIG. 1C. This may cause the above-mentioned reliability issues.

Figure 1B:
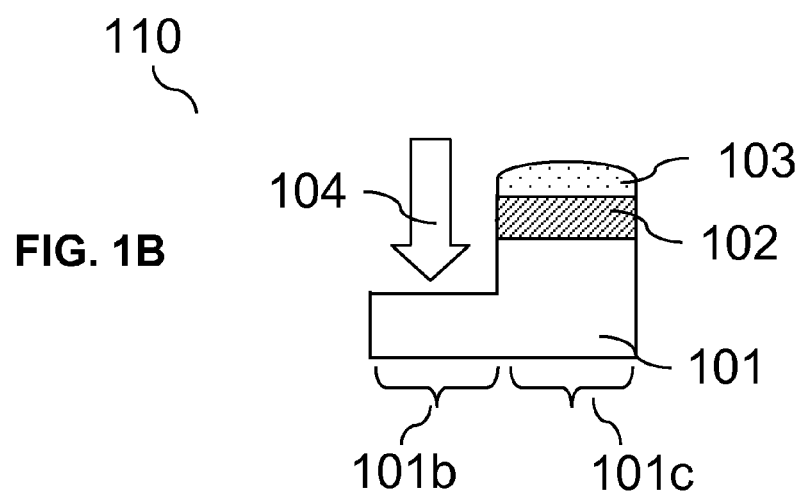
Figure 1C:
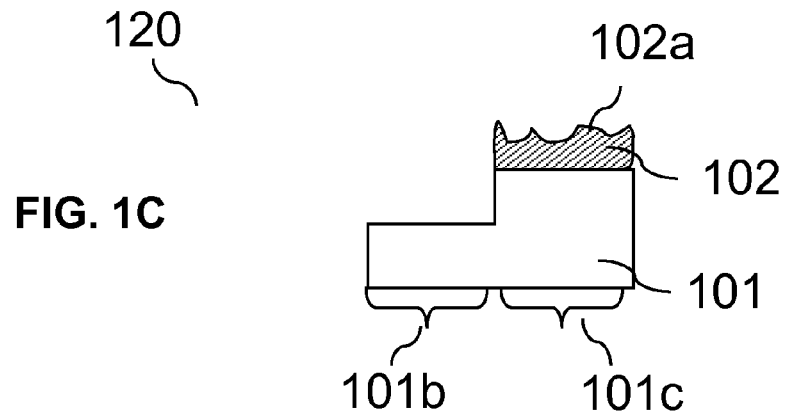

FIG. 1A to FIG. 1C show various views illustrating a conventional plasma etch process.

As shown in FIG. 1A in a view 100, a wafer 101 (for example, a silicon wafer) may be provided. The wafer 101 may include a first region 101b and a second region 101c. The first region 101b may be a kerf region of the wafer 101. The second region 101c may be a die region of the wafer 101. The second region 101c (die region) of the wafer 101 may, for example, include a chip or die that may be individualized by dicing the wafer 101. A passivation 102 such as, for example, an imide layer may be disposed over the wafer 101, for example over a front side 101a of the wafer 101, in the second region 101c. An etch mask 103 such as, for example, a resist mask may be disposed over the passivation 102.

As shown in FIG. 1B in a view 110, the first region 101b (kerf region) of the wafer 101 may be plasma etched (indicated by arrow 104) using the etch mask 103 as a mask.

As shown in FIG. 1C in a view 120, the etch mask 103 (for example, resist mask) may be removed from the passivation 102 after plasma etching the first region 101b of the wafer 101, using for example a plasma resist strip process and/or a wet removal process. In the conventional process shown in FIG. 1A to FIG. 1C, removal of the etch mask 103 may result in a damaged or eroded surface 102a of the passivation 102, as shown in FIG. 1C. This may, for example, cause the reliability issues mentioned above.

Various embodiments may provide methods for processing a wafer by means of etching, e.g. plasma etching, wherein degradation of or damage to a passivation or passivation layer (e.g. an imide passivation), for example a top surface of the passivation or passivation layer, may be prevented or substantially reduced by providing a protection layer between the passivation and an etch mask (e.g. resist mask). In one or more embodiments, plasma etching may, for example, be used for dicing the wafer. In one or more embodiments, plasma etching may, for example, be used for forming through-hole vias, e.g. through-silicon vias (TSVs), in the wafer. In accordance with other embodiments, plasma etching may be used for other purposes.

In one or more embodiments, a mask layer, e.g. a resist mask, may be selectively removed from a passivation layer, e.g. an imide passivation layer.

In one or more embodiments, selectivity between a mask layer, e.g. a resist mask, and a passivation layer, e.g. an imide passivation layer, for a plasma etching process and/or a wet chemical etching process may be increased.

An effect of one or more embodiments may be that attack of a passivation layer, e.g. an imide passivation layer, during an etching process, e.g. a plasma etching process and/or a wet chemical etching process, may be prevented or substantially reduced.

In one or more embodiments, a protection layer, e.g. a nitride layer, may be provided, wherein the protection layer may allow that a photoresist mask layer may be removed from the protection layer below with high selectivity.

In one or more embodiments, a passivation layer, e.g. an imide passivation layer, may be protected during an etching process, e.g. a plasma etching process and/or a wet chemical etching process, performed e.g. on a wafer, e.g. on a kerf region of the wafer.

An effect of one or more embodiments may be that a surface of a passivation layer, e.g. a surface of an imide passivation layer, may remain unchanged or substantially unchanged after a plasma resist strip and/or wet removal of a resist mask.

An effect of one or more embodiments may be that damage to a passivation layer, e.g. an imide passivation layer, may be prevented or substantially reduced.

An effect of one or more embodiments may be that delamination of chip packaging material from the passivation layer, e.g. an imide passivation layer, may be prevented or substantially reduced.

In one or more embodiments, a damage-free or substantially damage-free passivation layer surface (e.g. imide surface) may be obtained, which may be useful for e.g. packaging, integrity during reliability tests, and/or use in the field. In one or more embodiments, an imide surface may be prevented from being attacked or deteriorated, which may result in good package, reliability and/or field performance.

Figure 2:
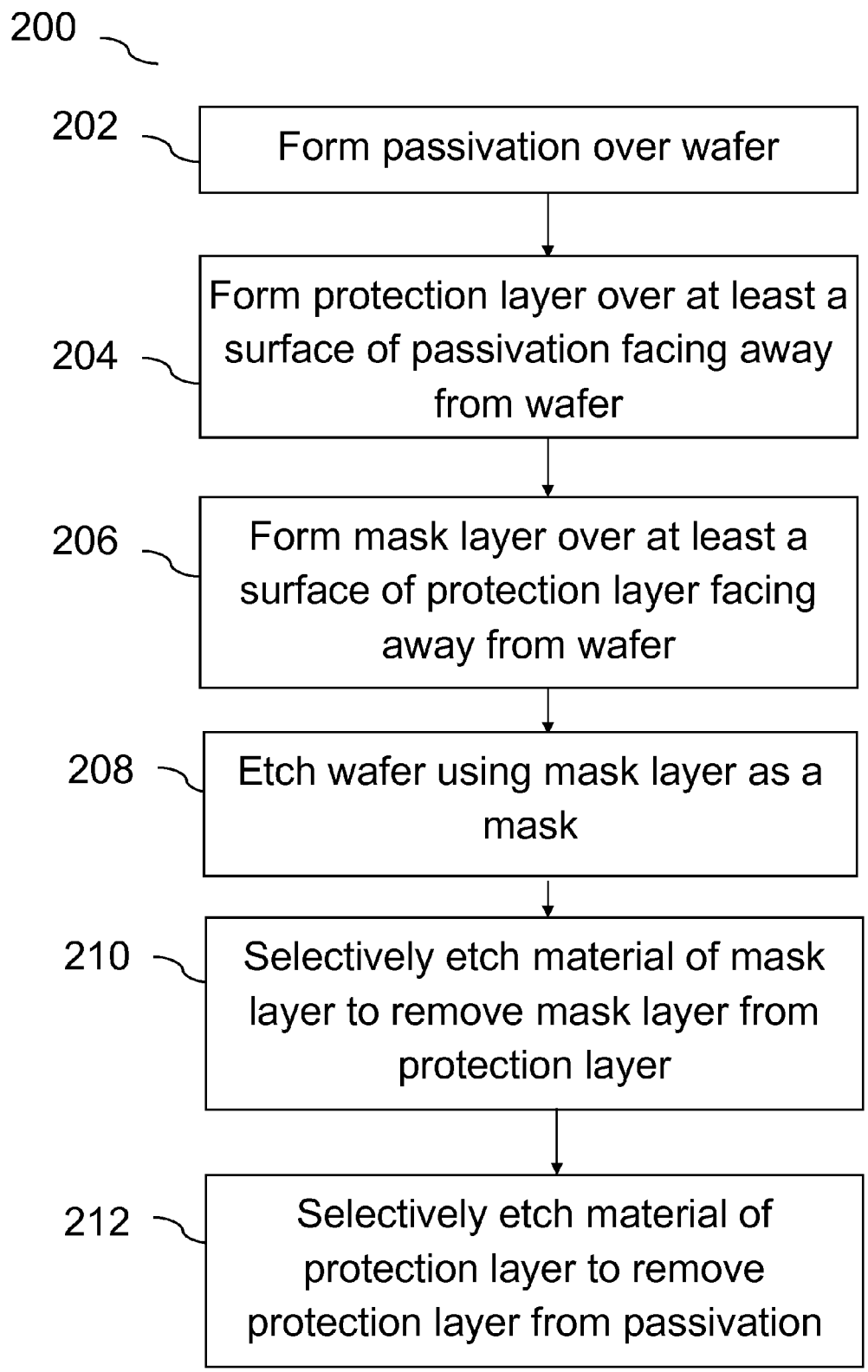
FIG. 2 shows a method for processing a wafer according to various embodiments.

FIG. 2 shows a method 200 for processing a wafer according to various embodiments.

The method 200 may include forming a passivation over a wafer (in 202); forming a protection layer over at least a surface of the passivation facing away from the wafer (in 204); forming a mask layer over at least a surface of the protection layer facing away from the wafer (in 206); etching the wafer using the mask layer as a mask (in 208); selectively etching the material of the mask layer to remove the mask layer from the protection layer, after etching the wafer (in 210); and selectively etching the material of the protection layer to remove the protection layer from the passivation, after selectively etching the material of the mask layer (in 212). In one or more embodiments, the surface of the passivation facing away from the wafer may include or may be a top surface of the passivation. In one or more embodiments, the surface of the protection layer facing away from the wafer may include or may be a top surface of the protection layer.

FIG. 3A to FIG. 3F show various views illustrating a method for processing a wafer according to various embodiments.

Figure 3A:
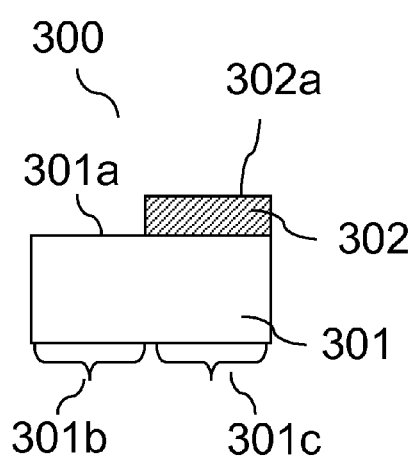

As shown in FIG. 3A in a view 300, a passivation 302 may be formed over a wafer 301.

In accordance with an embodiment, the wafer 301 may include or be a semiconductor wafer (for example, a silicon wafer, although other types of wafers may be possible as well). In accordance with an embodiment, the wafer 301 may include a first region 301b and a second region 301c. In one or more embodiments, the first region 301b may be a kerf region of the wafer 301. In one or more embodiments, the second region 301c may be a die region of the wafer 301.

In accordance with an embodiment, the passivation 302 may be formed over a front side 301a of the wafer 301, as shown in FIG. 3A.

In accordance with an embodiment, the passivation 302 may include or consist of at least one material selected from a group of materials, the group consisting of: an epoxy material (such as, for example, SU-8), an imide material, a polyimide material, benzocyclobutene (BCB).

In accordance with an embodiment, the passivation 302 may be formed by depositing a passivation layer over wafer 301, for example over the front side 301a of the wafer 301, and patterning the passivation layer deposited over the wafer 301.

In accordance with an embodiment, depositing a passivation layer over the wafer 301 (for example over the front side 301a of the wafer 301) may be performed using a deposition process such as, for example, at least one of a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, a sputtering process, and a spin coating process, or other suitable deposition processes, which may be known as such in the art.

In accordance with an embodiment, patterning the passivation layer may be performed by at least one of a lithographic process, a dry etching process, a wet etching process, and a laser photo-ablation process. By way of an example, the passivation layer may be patterned using a lithographic process, such as, for example, a photo-lithographic process (for example, a photo-lithographic process using UV (ultraviolet) light). In accordance with other embodiments, other suitable processes may be used for patterning the passivation layer.

In accordance with another embodiment, the passivation 302 (e.g. an imide passivation) may be formed by print processing. In one or more embodiments, print processing may include coating the wafer 301 with a passivation layer using a squeegee blade, and patterning the passivation layer by means of printing.

In accordance with an embodiment, patterning the passivation layer may include removing material of the passivation layer from above the first region 301b of the wafer 301, wherein material of the passivation layer may remain over the second region 301c of the wafer 301.

In accordance with an embodiment, the passivation 302 may have a thickness of at least about 0.5 micrometers, for example in the range from about 0.5 micrometers to about 50 micrometers, for example in the range from about 1 micrometer to about 40 micrometers, for example in the range from about 5 micrometers to about 30 micrometers, for example in the range from about 5 micrometers to about 20 micrometers, for example in the range from about 5 micrometers to about 10 micrometers, for example about 6 micrometers in accordance with one embodiment, although other values may be possible as well in accordance with other embodiments.

Figure 3B:
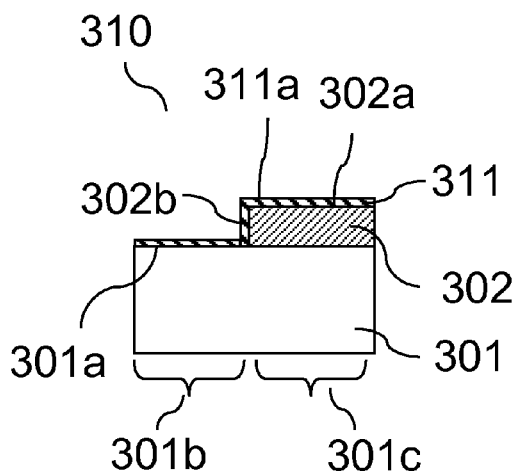

As shown in FIG. 3B in a view 310, a protection layer 311 may be formed over at least a surface 302a of the passivation 302 facing away from the wafer 301, for example a surface 302a facing away from the front side 301a of the wafer 301. In one or more embodiments, the surface 302a facing away from the wafer 301 may be a top surface of the passivation 302. In one or more embodiments, the protection layer 311 may be formed over the surface 302a facing away from the wafer 301, and over at least one sidewall 302b of the passivation 302, as shown in FIG. 3B. For example, the protection layer 311 may cover the surface 302a and the at least one sidewall 302b of the passivation 302. In one or more embodiments, the protection layer 311 may also be formed over a part of the wafer 301, e.g. a part of the front side 301a of the wafer 301, not covered by the passivation 302 (such as, for example, a part of the first region 301b of the wafer 301 which is not covered by the passivation 302), as shown in FIG. 3B.

The protection layer 311 may include or consist of a material that is selectively etchable to a material of the passivation 302. For example, in one or more embodiments the protection layer 311 may include or consist of a material that may be removed by etching with no or substantially no damage to the passivation 302. For example, in one or more embodiments the passivation layer 302 may serve as an etch stop when etching the protection layer 311.

In accordance with an embodiment, the material of the protection layer 311 may be selected from a group of materials, the group consisting of: silicon nitride; carbon (e.g. pure carbon), carbon containing nitrogen, silicon containing carbon, polysilicon, and a resist material (for example a photoresist), although other materials may be possible as well in accordance with other embodiments. The specific choice of the material or materials of the protection layer 311 may, for example, be made taking into account the material used for the passivation 302, and/or taking into account a ratio of an etch rate of the material of the protection layer 311 to an etch rate of the material of the passivation 302 for a particular etching process, sometimes also referred to as etch selectivity.

In accordance with an embodiment, the material of the protection layer 311 may be selected such that an etch selectivity (i.e. ratio of an etch rate of the material of the protection layer 311 to an etch rate of the material of the passivation 302) may be greater than or equal to about 2, for example greater than or equal to about 10, for example greater than or equal to about 100.

In accordance with an embodiment, the protection layer 311 may be formed using a deposition process such as, for example, at least one of a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, and a sputtering process, or other suitable deposition processes, which may be known as such in the art.

In accordance with an embodiment, the protection layer 311 may have a thickness of at least about 20 nanometers, for example in the range from about 20 nanometers to about 2000 nanometers, for example in the range from about 20 nanometers to about 1000 nanometers, for example in the range from about 20 nanometers to about 500 nanometers, for example in the range from about 20 nanometers to about 100 nanometers, for example a thickness of about 40 nanometers in accordance with one embodiment, although other values may be possible as well in accordance with other embodiments.

In accordance with another embodiment, the thickness of the protection layer 311 may for example be a decade smaller than the thickness of the passivation 302.

Figure 3C:
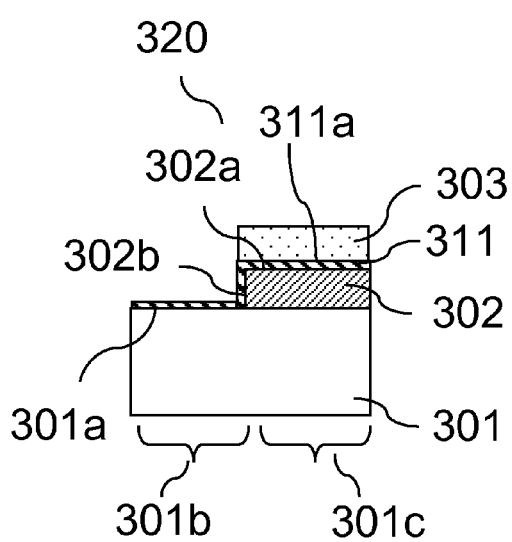

As shown in FIG. 3C in a view 320, a mask layer 303 may be formed over at least a surface 311a of the protection layer 311 facing away from the wafer 301, for example a top surface of the protection layer 311, as shown.

The mask layer 303 may include or consist of a material that is selectively etchable to the material of the protection layer 311. For example, in one or more embodiments the mask layer 303 may include or consist of a material that may be removed by etching with no or substantially no damage to the protection layer 311. For example, in one or more embodiments the protection layer 311 may serve as an etch stop when etching the mask layer 303.

In accordance with an embodiment, the material of the mask layer 303 may be selected from a group of materials, the group consisting of: a resist material, such as, for example, a photoresist, an imide material, a polyimide material, an epoxy material (such as, for example, SU-8), benzocyclobutene (BCB), although other materials may be possible as well in accordance with other embodiments. The specific choice of the material or materials of the mask layer 303 may, for example, be made taking into account the material used for the protection layer 311, and/or taking into account a ratio of an etch rate of the material of the mask layer 303 to an etch rate of the material of the protection layer 311 for a particular etching process (etch selectivity).

In accordance with an embodiment, the material of the mask layer 303 may be selected such that an etch selectivity (i.e. ratio of an etch rate of the material of the mask layer 303 to an etch rate of the material of the protection layer 311) may be greater than or equal to about 2, for example greater than or equal to about 10, for example greater than or equal to about 100.

In one or more embodiments, the material of the mask layer 303 may include or be a negative photoresist and the material of the protection layer 311 may include or be a positive photoresist, or vice versa In accordance with an embodiment, the mask layer 303 may be formed by depositing the mask layer 303 over at least the protection layer 311, and patterning the deposited mask layer.

In accordance with an embodiment, depositing the mask layer 303 over at least the protection layer 311 may be performed using a deposition process such as, for example, at least one of a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, a spin-coating process, and a sputtering process, although other suitable deposition processes may be used in accordance with other embodiments, which may be known as such in the art.

Figure 4A:
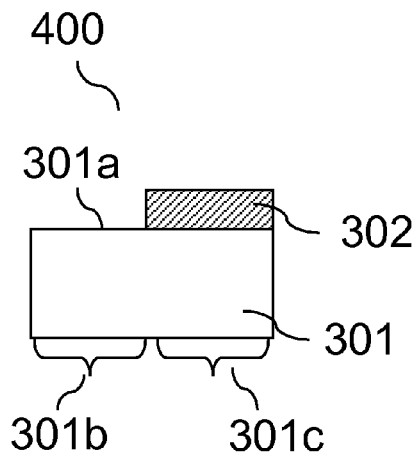
FIG. 4A to FIG. 4G show various views illustrating a method for processing a wafer according to various embodiments.
Figure 4B:
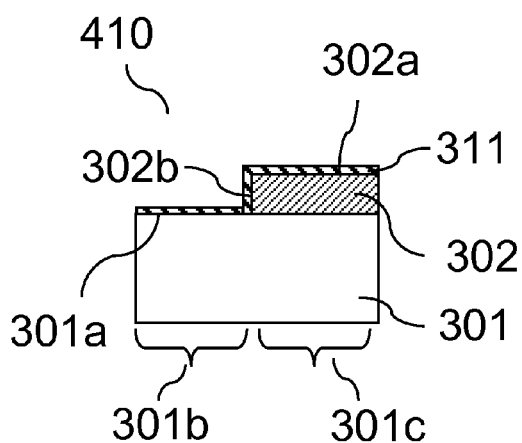
Figure 4C:
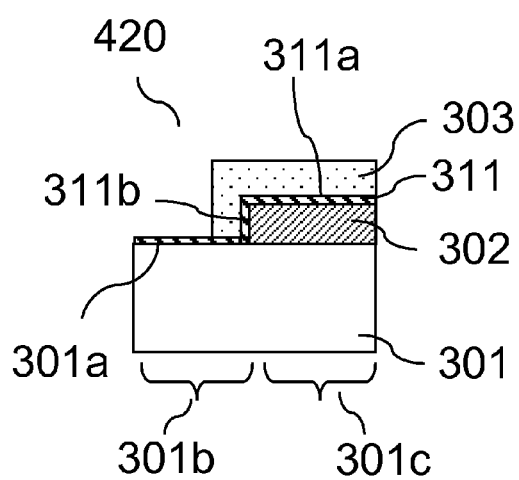

In accordance with one or more embodiments, the mask layer 303 may be deposited over the surface 311a of the protection layer 311 and at least one sidewall 311b of the protection layer 311 (see FIG. 4C). In accordance with one or more embodiments, the mask layer 303 may be deposited over a part of the wafer 301, e.g. a part of the front side 301a of the wafer 301, not covered by the passivation 302 (such as, for example, a part of the first region 301b of the wafer 301 which is not covered by the passivation 302).

In accordance with an embodiment, the mask layer 303 may have a thickness of at least about 0.5 micrometers, for example in the range from about 0.5 micrometers to about 50 micrometers, for example in the range from about 1 micrometer to about 40 micrometers, for example in the range from about 5 micrometers to about 30 micrometers, for example in the range from about 5 micrometers to about 20 micrometers, for example in the range from about 5 micrometers to about 10 micrometers, for example about 6 micrometers in accordance with one embodiment, although other values may be possible as well in accordance with other embodiments.

Figure 3D:
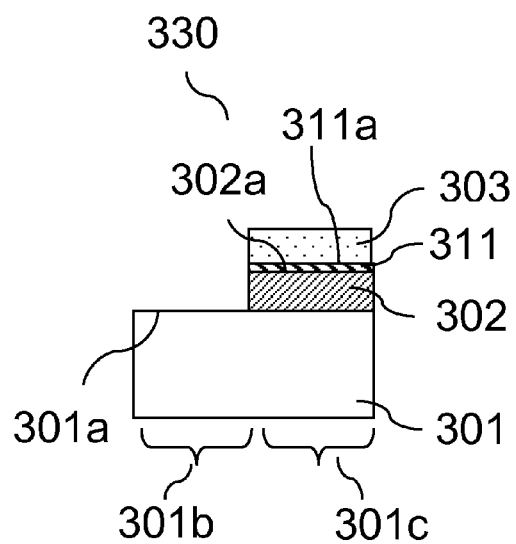

As shown in FIG. 3D in a view 330, in one or more embodiments material of the protection layer 311 covering the wafer 301 in the first region 301b may be etched to remove the protection layer 311 from above the first region 301b of the wafer 301. In one or more embodiments, etching the material of the protection layer 311 may include etching the material of the protection layer 311 such that the protection layer 311 is removed from the at least one sidewall 302b of the passivation 302, as shown in FIG. 3D. In one or more embodiments, etching the material of the protection layer 311 may be carried out before plasma etching the first region 301b of the wafer 301. In one or more embodiments, etching the material of the protection layer 311 and plasma etching the first region 301b of the wafer 301 may be carried out as separate processes. In one or more embodiments, etching the material of the protection layer 311 may be carried out as a preprocess of a plasma etch process for plasma etching the first region 301b of the wafer 301, e.g. as a preprocess of a so-called Bosch process. A Bosch process is described in Laermer et al., "Method of anisotropically etching silicon" U.S. Pat. No. 5,501,893 granted Mar. 26, 1996, the content of which is hereby incorporated by reference in its entirety.

In accordance with an embodiment, etching the material of the protection layer 311 to remove the protection layer 311 from the at least one sidewall 302b of the passivation 302 may include selectively etching the material of the protection layer 311 to remove the protection layer 311 from the at least one sidewall 302b of the passivation 302. For example, in one or more embodiments the material of the protection layer 311 may be removed by etching with no or substantially no damage to the sidewall 302b of the passivation 302 and/or to the mask layer 303. For example, in one or more embodiments the sidewall 302b of the passivation 302 and/or the mask layer 303 may serve as an etch stop when etching the protection layer 311 to remove the protection layer 311 from the at least one sidewall 302b of the passivation 302. Accordingly, in one or more embodiments, the protection layer 311 may include or consist of a material that is selectively etchable to a material of the mask layer 303. Accordingly, in one or more embodiments, the protection layer 311 may include or consist of a material that is selectively etchable to a material of the passivation 302.

In accordance with an embodiment, selectively etching the material of the protection layer 311 may be performed using a plasma etch process, although other suitable etching processes may be used in accordance with other embodiments, which may be known as such in the art.

In one or more embodiments, the plasma etch process may be carried out at a temperature of at least about 10° C., for example in the range from about 10° C. to about 150° C., for example in the range from about 50° C. to about 120° C., for example at a temperature of about 80° C. in accordance with one embodiment, although other temperatures may be possible as well in accordance with other embodiments.

In accordance with an embodiment, the plasma of the plasma etch process used for selectively etching the material of the protection layer 311 may include a $CF_4/O_2$ process gas mixture, although other plasma gas mixtures may be possible as well in accordance with other embodiments.

Illustratively, FIG. 3D shows a layer arrangement in accordance with various embodiments. As shown, the layer arrangement may include: a wafer 301; a passivation 302 disposed over the wafer 301; a protection layer 311 disposed over at least a surface 302a of the passivation 302 facing away from the wafer 301; and a mask layer 303 disposed over at least a surface 311a of the protection layer 311 facing away from the wafer 301, wherein the protection layer 311 may include a material that is selectively etchable to a material of the passivation 302, and wherein the mask layer 303 may include a material that is selectively etchable to the material of the protection layer 311. Illustratively, the layer arrangement may include a layer stack including the passivation 302, the protection layer 311, and the mask layer 303. It should be noted that, in accordance with one or more embodiments, the layer stack may include additional layers. For example, the layer stack may include one or more additional passivation, protection, and/or mask layers. For example, in accordance with one or more embodiments, the layer sequence 302/311/303 may be repeated (e.g. doubled, tripled, quadrupled, etc.).

As shown in FIG. 3E in a view 340, the first region 301b of the wafer 301 may be etched (indicated by arrow 331), using the mask layer 303 as a mask.

In one or more embodiments, the first region 301b of the wafer 301 may be etched using a plasma etching process, such as for example, a Bosch process. In accordance with an embodiment, an etchant gas, such as, for example, nitrogen trifluoride ($NF_3$) or tetrafluoromethane ($CF_4$), may be used in the plasma etching process. In another embodiment, sulphur hexafluoride ($SF_6$) and helium (He) may be used in the plasma etching process, for example in a Bosch process.

In or more embodiments, etching, e.g. plasma etching, the first region 301b of the wafer 301 may include or may be carried out for dicing the wafer 301. For example, etching the first region 301b of the wafer may include etching all the way through the wafer 301 to individualize the second region 301c (e.g. die region 301c) of the wafer 301. As shown in FIG. 3E, etching the first region 301b of the wafer 301, e.g. for dicing the wafer 301, may deteriorate the mask layer 303, for example due to a long process time of a plasma etch process used for etching.

As shown in FIG. 3F in a view 350, the material of the mask layer 303 may be etched to remove the mask layer 303 from the protection layer 302, after etching, e.g. plasma etching, the wafer 301.

In accordance with an embodiment, etching the material of the mask layer 303 to remove the mask layer 303 from the protection layer 311 may include selectively etching the material of the mask layer 303 to remove the mask layer 303 from the protection layer 311. For example, in one or more embodiments the material of the mask layer 303 may be removed by etching with no or substantially no damage to the protection layer 311. For example, in one or more embodiments the protection layer 311 may serve as an etch stop when etching the mask layer 303.

In accordance with an embodiment, selectively etching the material of the mask layer 303 may be performed using an etch process, such as, for example, at least one of an ashing process and a wet etch process, although other suitable etch processes may be used in accordance with other embodiments, which may be known as such in the art.

In accordance with an embodiment, an ashing process used to selectively etch the material of the mask layer 303 may include or may be an $O_2$-plasma ashing process. In accordance with an embodiment, the ashing process, for example, an $O_2$-plasma ashing process, may be carried out at a temperature of at least about 150° C., for example in the range from about 150° C. to about 300° C., for example in the range from about 180° C. to about 280° C., for example in the range from about 200° C. to about 260° C., for example about 250° C. in accordance with one embodiment, although other temperatures may be possible as well in accordance with other embodiments.

In accordance with an embodiment, a wet etch process used to selectively etch the material of the mask layer 303 may, for example, include or be a wet chemical resist strip process, for example when the mask layer 303 includes or consists of a resist material.

As shown in FIG. 3G in a view 360, the material of the protection layer 311 may be etched to remove the protection layer 311 from the passivation 302, after etching, e.g. selectively etching, the material of the mask layer 303.

In accordance with an embodiment, etching the material of the protection layer to remove the protection layer 311 from the passivation 302 may include selectively etching the material of the protection layer 311. For example, in one or more embodiments the material of the protection layer 311 may be removed by etching with no or substantially no damage to the passivation 302. For example, in one or more embodiments the passivation 302 may serve as an etch stop when etching the protection layer 311.

In accordance with an embodiment, etching (e.g. selectively etching) the material of the protection layer 311 may be performed using a plasma etch process, although other suitable etching processes may be used in accordance with other embodiments, which may be known as such in the art.

In accordance with an embodiment, a plasma etch process used for etching (e.g. selectively etching) the material of the protection layer 311 may include at least one of an isotropic plasma etch process, an anisotropic plasma etch process or a directional plasma etch process.

In accordance with an embodiment, the plasma etch process may be carried out at a temperature of at least about 10° C., for example in the range from about 10° C. to about 150° C., for example in the range from about 50° C. to about 120° C., for example about 80° C., in accordance with one embodiment, although other temperatures may be possible as well in accordance with other embodiments.

In accordance with an embodiment, a gas mixture of the plasma etch process used for etching (e.g. selectively etching) the material of the protection layer 311 may include a $CF_4/O_2$ process gas mixture in accordance with one embodiment, although other process gas mixtures may be possible as well in accordance with other embodiments.

FIG. 4A to FIG. 4G show various views illustrating a method for processing a wafer according to various embodiments.

The method is to some extent similar to the method described above in connection with FIG. 3A to FIG. 3G. In particular, reference signs in FIG. 4A to FIG. 4G that are the same as in FIG. 3A to FIG. 3F denote the same or similar elements as in FIG. 3A to FIG. 3F. Thus, those elements will not be described in detail again here; reference is made to the description above.

As shown in FIG. 4A in a view 400, a passivation 302 may be formed over a wafer 301. The further features described above with regards to the wafer 301 and the passivation 302 shown in FIG. 3A may be equally applicable for wafer 301 and the passivation 302 shown in FIG. 4A.

As shown in FIG. 4B in a view 410, a protection layer 311 may be formed over at least a surface 302a of the passivation 302 facing away from the wafer 301, for example a surface 302a facing away from the front side 301a of the wafer 301, for example a top surface of the passivation 302. The further features described above with regards to the protection layer 311 shown in FIG. 3B may be equally applicable for the protection layer 311 shown in FIG. 4B.

As shown in FIG. 4C in a view 420, a mask layer 303 may be formed over at least a surface 311a of the protection layer 311 facing away from the wafer 301 (for example, a top surface of the protection layer 311), and over at least one sidewall 311b of the protection layer 311. In one or more embodiments, the mask layer 303 may also be formed over a part of the wafer 301, e.g. a part of the front side 301a of the wafer 301, not covered by the passivation 302 (such as, for example, a part of the first region 301b of the wafer 301 which is not covered by the passivation 302), for example over a part of the protection layer 311 in the first region 301b, as shown in FIG. 4C. The further features described above with regards to the mask layer 303 shown in FIG. 3C may be equally applicable for the mask layer 303 shown in FIG. 4C.

Figure 4D:
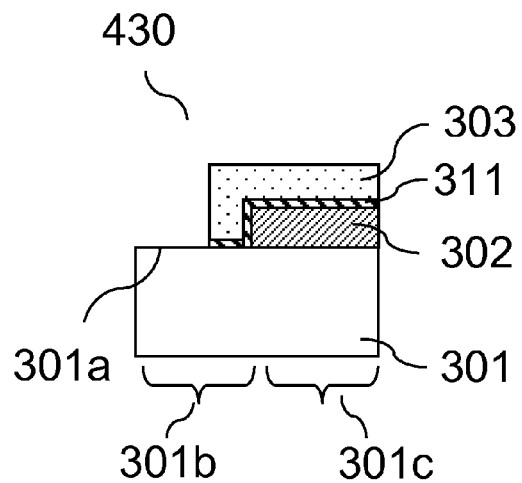

As shown in FIG. 4D in a view 430, in one or more embodiments, material of the protection layer 311 covering the wafer 301 in the first region 301b may be etched to remove the protection layer 311 from above the first region 301b of the wafer 301. In one or more embodiments, etching the material of the protection layer 311 from above the first region 301b of the wafer 301 may include removing the protection layer 311 from above the first region 301b of the wafer 301 not covered by the mask layer 303, for example, as shown in FIG. 4D. The further features described above with regards to etching the protection layer 311 shown in FIG. 3D may be equally applicable in respect of etching the protection layer 311 in FIG. 4D.

Figure 4E:
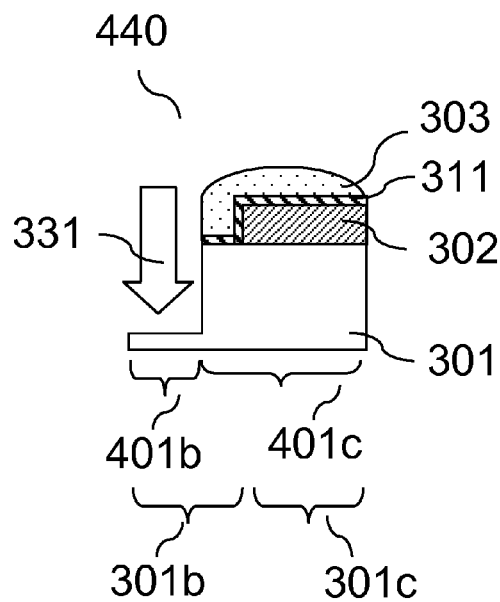

As shown in FIG. 4E in a view 440, a part 401b of the first region 301b of the wafer 301 may be etched (indicated by arrow 331), using the mask layer 303 as a mask. In one or more embodiments, the part 401b of the first region 301b of the wafer 301 may include or correspond to a kerf region of the wafer 301. In one or more embodiments, a region 401c including a part of the first region 301b of the wafer 301 and a part of the second region 301c of the wafer 301 may include or correspond to a die region of the wafer 301. The further features described above with regards to the etching process 331 shown in FIG. 3E may be equally applicable in respect of the etching process 331 shown in FIG. 4D.

Figure 4F:
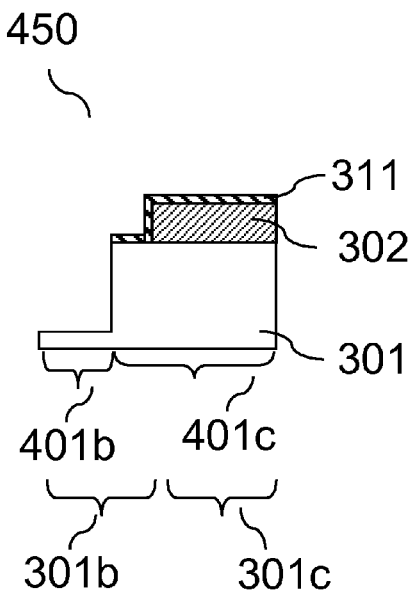

As shown in FIG. 4F in a view 450, the material of the mask layer 303 shown in FIG. 4E may be etched, e.g. selectively etched, to remove the mask layer 303 from the protection layer 302, after etching, e.g. plasma etching, the part 401b of the first region 301b of the wafer 301. The further features described above with regards to etching the mask layer 303 as described in connection with FIG. 3F may be equally applicable in respect of etching the mask layer 303 shown in FIG. 4E.

Figure 4G:
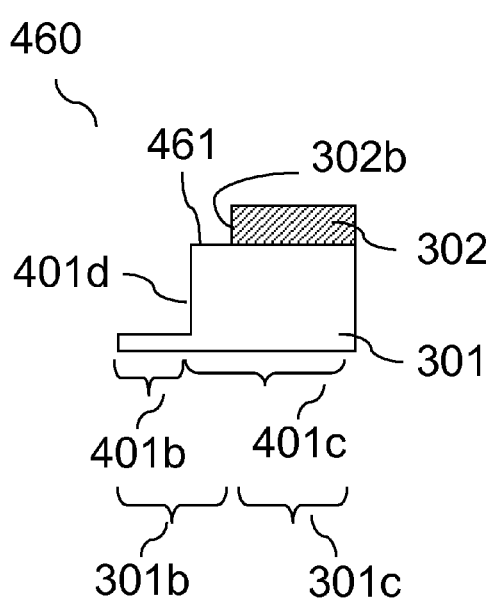

As shown in FIG. 4G in a view 460, the material of the protection layer 311 shown in FIG. 4F may be etched, e.g. selectively etched, to remove the protection layer 311 from the passivation 302, after etching, e.g. selectively etching, the material of the mask layer 303. The further features described above with regards to etching the protection layer 311 as described in connection with FIG. 3G may be equally applicable in respect of etching the protection layer 311 shown in FIG. 4F.

According to the embodiment shown in FIG. 4G, after removing the protection layer 311 from the passivation 302, the passivation 302 may show a recess with respect to the die region 401c of the wafer 301, wherein for example a step 461 may become apparent between the edge 401d of the die region 401c and the sidewall 302b of the passivation 302.

According to one or more embodiments, a method for processing a wafer may be provided. In one or more embodiments, the method may include: depositing an imide passivation layer on a wafer; densifying the imide passivation layer; and depositing a protection layer over the densified imide passivation layer. In an embodiment, the protection layer may be a silicon nitride protection layer having a thickness of about 40 nanometers, although other thicknesses may be possible, e.g. a thickness in the range from about 20 nanometers to about 2000 nanometers. In another embodiment, the protection layer may be a layer of material including silicon containing carbon. In an embodiment, a material of the protection layer may be a material that may be selectively etchable to a photo resist material of a photoresist mask that may be formed over the protection layer as part of a photolithography process. In one or more embodiments, the photoresist material may be a negative photoresist material.

In one or more embodiments, the method for processing the wafer may further include: applying a lithography process for a plasma die etch process after depositing the protection layer, which may include forming the photoresist mask; and removing a part of the protection layer from a dicing area after applying the lithography process. In one or more embodiments, the part of the protection layer may be removed by an isotropic plasma etch process at 80° C., although other temperatures may be possible, e.g., a temperature in a range from about 10° C. to about 150° C. In one or more embodiments, the isotropic plasma etch process at 80° C. may have high selectivity to the photoresist material of the photoresist mask and the imide passivation layer. In one or more embodiments, the isotropic plasma etch process at a temperature in a range from about 10° C. to about 150° C. may have good selectivity to the photoresist material of the photoresist mask and the imide passivation layer. In one or more embodiments, the part of the protection layer may be removed by a pre-process of a plasma dicing process. In one or more embodiments, the pre-process of the plasma dicing process may be performed with a $CF_4/O_2$ process gas mixture. In one or more embodiments, the part of the protection layer may be removed by a pre-process of a Bosch etch process.

In one or more embodiments, the method for processing the wafer may further include: performing a plasma etch process for dicing after removing the part of the protection layer from the dicing area.

In one or more embodiments, the method for processing the wafer may further include: stripping the photoresist of the photoresist mask after the plasma etch process. In one or more embodiments, an $O_2$ plasma ashing process may be used to strip the photoresist. In one or more embodiments, the $O_2$ plasma ashing process may be performed at a temperature of 250° C., although other temperatures may be possible. In an embodiment, the $O_2$ plasma ashing process performed at a temperature of 250° C. may be selective to the underlying protection layer (e.g. nitride protection layer). In one or more embodiments, a wet chemical resist strip may be used to strip the photoresist of the photoresist mask.

In one or more embodiments, the method for processing the wafer may further include: removing the protection layer (e.g. nitride protection layer). In one or more embodiments, a short isotropic plasma etch process may be used to remove the protection layer (e.g. nitride protection layer). In one or more embodiments, the short isotropic plasma etch process may carried out at a temperature of about 80° C., although other temperatures may be possible. In one or more embodiments, the short isotropic plasma etch process at a temperature of about 80° C. may be highly selective to the underlying imide passivation layer. In one or more embodiments, the underlying imide passivation layer may not be attacked or deteriorated.

A method for processing a wafer in accordance with various embodiments may include: forming a passivation over the wafer; forming a protection layer over at least a surface of the passivation facing away from the wafer, wherein the protection layer may include a material that is selectively etchable to a material of the passivation; forming a mask layer over at least a surface of the protection layer facing away from the wafer, wherein the mask layer may include a material that is selectively etchable to the material of the protection layer; etching the wafer using the mask layer as a mask; selectively etching the material of the mask layer to remove the mask layer from the protection layer, after etching the wafer; and selectively etching the material of the protection layer to remove the protection layer from the passivation, after selectively etching the material of the mask layer.

In one or more embodiments, forming the passivation over the wafer may include forming the passivation over a front side of the wafer.

In one or more embodiments, etching the wafer using the mask layer as a mask may include plasma etching the wafer using the mask layer as a mask.

In one or more embodiments, the material of the protection layer may be further selectively etchable to the material of the mask layer.

In one or more embodiments, the material of the passivation may be selected from a group of materials, the group consisting of: an epoxy material; an imide material; a polyimide material; and benzocyclobutene.

In one or more embodiments, forming the passivation over the front side of the wafer may include: depositing a passivation layer over the front side of the wafer; and patterning the passivation layer.

In one or more embodiments, patterning the passivation layer may include a lithographic process.

In one or more embodiments, the material of the protection layer may be selected from a group of materials, the group consisting of: silicon nitride; carbon (e.g. pure carbon), carbon containing nitrogen, silicon containing carbon, polysilicon, and a resist material (e.g. a photoresist).

In one or more embodiments, forming the protection layer over at least the surface of the passivation facing away from the wafer may include: forming the protection layer over the surface of the passivation facing away from the wafer and over at least one sidewall of the passivation.

In one or more embodiments, forming the protection layer over at least the surface of the passivation facing away from the wafer may include: depositing the protection layer over the surface of the passivation facing away from the wafer and over at least one sidewall of the passivation, before forming the mask layer over the surface of the protection layer facing away from the wafer; and selectively etching the material of the protection layer to remove the protection layer from the at least one sidewall of the passivation, after forming the mask layer over the surface of the protection layer facing away from the wafer, and before etching the wafer.

In one or more embodiments, selectively etching the material of the protection layer to remove the protection layer from the at least one sidewall of the passivation may include a plasma etch process.

In one or more embodiments, the plasma etch process may be carried out at a temperature in the range from about 10° C. to about 150° C.

In one or more embodiments, the plasma etch process may be an isotropic plasma etch process.

In one or more embodiments, selectively etching the material of the protection layer to remove the protection layer from the at least one sidewall of the passivation may include using a $CF_4/O_2$ process gas mixture.

In one or more embodiments, the material of the mask layer may be selected from a group of materials, the group consisting of: a resist material, an imide material, a polyimide material, an epoxy material, benzocyclobutene.

In one or more embodiments, the material of the mask layer may include a negative photoresist and the material of the protection layer may include a positive photoresist, or vice versa.

In one or more embodiments, forming the mask layer over at least the surface of the protection layer facing away from the wafer may include: depositing the mask layer over the protection layer; and patterning the mask layer before etching the wafer.

In one or more embodiments, etching the wafer may include dicing the wafer.

In one or more embodiments, plasma etching the wafer may include a Bosch plasma etch process.

In one or more embodiments, forming the protection layer over at least the surface of the passivation facing away from the wafer may include: forming the protection layer over the surface facing away from the wafer and at least one sidewall of the passivation, and over a part of the front side of the wafer not covered by the passivation.

In one or more embodiments, forming the protection layer over at least the surface of the passivation facing away from the wafer may include: depositing the protection layer over the surface of the passivation facing away from the wafer and at least one sidewall of the passivation, and over a part of the front side of the wafer not covered by the passivation; and selectively etching the material of the protection layer to remove the protection layer from the at least one sidewall of the passivation, and from the part of the front side of the wafer not covered by the passivation, after forming the mask layer over the surface of the protection layer facing away from the wafer, and before etching the wafer.

In one or more embodiments, forming the protection layer over at least the surface of the passivation facing away from the wafer may include forming the protection layer over the surface of the passivation facing away from the wafer and at least one sidewall of the passivation, and forming the mask layer over at least the surface of the protection layer facing away from the wafer may include forming the mask layer over the surface of the protection layer facing away from the wafer and at least one sidewall of the protection layer.

In one or more embodiments, the material of the passivation may include an imide material, the material of the protection layer may include silicon nitride, and the material of the mask layer may include a photoresist, e.g. a negative photoresist.

In one or more embodiments, the material of the protection layer may include a positive photoresist and the material of the mask layer may include a negative photoresist, or vice versa.

In one or more embodiments, the passivation may have a thickness in the range from about 0.5 micrometers to about 50 micrometers.

In one or more embodiments, the passivation may have a thickness of about 6 micrometers.

In one or more embodiments, the mask layer may have a thickness in the range from about 0.5 micrometers to about 50 micrometers.

In one or more embodiments, the mask layer may have a thickness of about 6 micrometers.

In one or more embodiments, the protection layer may have a thickness in the range from about 20 nanometers to about 2000 nanometers.

In one or more embodiments, the protection layer may have a thickness of about 40 nanometers.

In one or more embodiments, selectively etching the material of the mask layer to remove the mask layer from the protection layer may include an ashing process.

In one or more embodiments, the ashing process used to remove the mask layer from the protection layer may be an $O_2$-plasma ashing process.

In one or more embodiments, the $O_2$-plasma ashing process used to remove the mask layer from the protection layer may be carried out at a temperature in the range from about 150° C. to about 300° C.

In one or more embodiments, the $O_2$-plasma ashing process used to remove the mask layer from the protection layer may be carried out at a temperature of about 250° C.

In one or more embodiments, selectively etching the material of the mask layer to remove the mask layer from the protection layer may include a wet etch process.

In one or more embodiments, the material of the mask layer may include a resist material, and selectively etching the material of the mask layer to remove the mask layer from the protection layer may include a wet chemical resist strip process.

In one or more embodiments, selectively etching the material of the protection layer to remove the protection layer from the passivation layer may include a plasma etch process.

In one or more embodiments, the plasma etch process used to remove the protection layer from the passivation layer may be carried out at a temperature in the range from about 10° C. to about 150° C.

In one or more embodiments, the plasma etch process used to remove the protection layer from the passivation layer may be carried out at a temperature of about 80° C.

In one or more embodiments, the plasma etch process used to remove the protection layer from the passivation layer may be an isotropic plasma etch process.

In one or more embodiments, selectively etching the material of the protection layer to remove the protection layer from the passivation layer may include using a $CF_4/O_2$ process gas mixture.

A layer arrangement in accordance with various embodiments may include: a wafer; a passivation disposed over a the wafer; a protection layer disposed over at least a surface of the passivation facing away from the wafer; and a mask layer disposed over at least a surface of the protection layer facing away from the wafer, wherein the protection layer includes a material that is selectively etchable to a material of the passivation, and wherein the mask layer includes a material that is selectively etchable to the material of the protection layer.

In one or more embodiments, the passivation may be disposed over a front side of the wafer.

In one or more embodiments, the material of the protection layer may be further selectively etchable to the material of the mask layer.

In one or more embodiments, the material of the passivation may be selected from a group of materials, the group consisting of: an epoxy material; an imide material; a polyimide material; and benzocyclobutene.

In one or more embodiments, the material of the protection layer may be selected from a group of materials, the group consisting of: silicon nitride; carbon (e.g. pure carbon), carbon containing nitrogen, silicon containing carbon, polysilicon, and a resist material (e.g. a photoresist).

In one or more embodiments, the protection layer may be disposed over the surface of the passivation facing away from the wafer and at least one sidewall of the passivation.

In one or more embodiments, the material of the mask layer may be selected from a group of materials, the group consisting of: a resist material, an imide material, a polyimide material, an epoxy material, benzocyclobutene.

In one or more embodiments, the protection layer may be disposed over the surface of the passivation facing away from the wafer and at least one sidewall of the passivation, and the mask layer of the layer arrangement may be disposed over the surface of the protection layer facing away from the wafer and at least one sidewall of the protection layer.

In one or more embodiments, the material of the passivation may include an imide material, the material of the protection layer may include silicon nitride, and the material of the mask layer may include a photoresist, e.g. a negative photoresist.

In one or more embodiments, the material of the protection layer may include a positive photoresist and the material of the mask layer may include a negative photoresist, or vice versa.

In one or more embodiments, the passivation may have a thickness in the range from about 0.5 micrometers to about 50 micrometers.

In one or more embodiments, the passivation may have a thickness of about 6 micrometers.

In one or more embodiments, the mask layer may have a thickness in the range from about 0.5 micrometers to about 50 micrometers.

In one or more embodiments, the mask layer may have a thickness of about 6 micrometers.

In one or more embodiments, the protection layer may have a thickness in the range from about 20 nanometers to about 2000 nanometers.

In one or more embodiments, the protection layer may have a thickness of about 40 nanometers.

While various aspects of this disclosure have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for processing a wafer, the method comprising:
    forming a passivation over the wafer;
    forming a protection layer over at least a surface of the passivation facing away from the wafer, wherein the protection layer comprises a material that is selectively etchable to a material of the passivation;
    forming a mask layer over at least a surface of the protection layer facing away from the wafer, wherein the mask layer comprises a material that is selectively etchable to the material of the protection layer;
    etching the wafer using the mask layer as a mask;
    selectively etching the material of the mask layer to remove the mask layer from the protection layer, after etching the wafer;
    selectively etching the material of the protection layer to remove the protection layer from the passivation, after selectively etching the material of the mask layer; and
    disposing chip packaging material on the passivation after selectively etching the material of the protection layer.

2. The method according to claim 1,
    wherein forming the passivation over the wafer comprises forming the passivation over a front side of the wafer.

3. The method according to claim 1,
    etching the wafer using the mask layer as a mask comprises plasma etching the wafer using the mask layer as a mask.

4. The method according to claim 3,
    wherein plasma etching the wafer comprises a Bosch plasma etch process.

5. The method according to claim 1,
    wherein the material of the protection layer is further selectively etchable to the material of the mask layer.

6. The method according to claim 1,
    wherein the material of the passivation is selected from a group of materials, the group consisting of:
    an epoxy material;
    an imide material;
    a polyimide material; and
    benzocyclobutene.

7. The method according to claim 1, wherein the material of the protection layer is selected from a group of materials, the group consisting of:

silicon nitride;
carbon;
carbon containing nitrogen;
silicon containing carbon;
polysilicon; and
a resist material.

8. The method according to claim 1, wherein the material of the mask layer is selected from a group of materials, the group consisting of:
a resist material;
an imide material;
a polyimide material;
an epoxy material;
benzocyclobutene.

9. The method according to claim 1,
wherein etching the wafer comprises dicing the wafer.

10. The method according to claim 1, wherein the protection layer has a thickness in the range from about 20 nanometers to about 2000 nanometers.

11. The method according to claim 1, wherein selectively etching the material of the protection layer to remove the protection layer from the passivation comprises a plasma etch process.

12. A method for processing a wafer, the method comprising:
forming a passivation over the wafer;
forming a protection layer over at least a surface of the passivation facing away from the wafer, wherein the protection layer comprises a material that is selectively etchable to a material of the passivation;
forming a mask layer over at least a surface of the protection layer facing away from the wafer, wherein the mask layer comprises a material that is selectively etchable to the material of the protection layer;
etching the wafer using the mask layer as a mask;
selectively etching the material of the mask layer to remove the mask layer from the protection layer, after etching the wafer; and
selectively etching the material of the protection layer to remove the protection layer from the passivation, after selectively etching the material of the mask layer, wherein forming the protection layer over at least the surface of the passivation facing away from the wafer comprises:
forming the protection layer over the surface of the passivation facing away from the wafer and over at least one sidewall of the passivation.

13. The method according to claim 12, wherein forming the protection layer over the surface of the passivation facing away from the wafer and over at least one sidewall of the passivation comprises:
depositing the protection layer over the surface of the passivation facing away from the wafer and over at least one sidewall of the passivation, before forming the mask layer over the surface of the protection layer facing away from the wafer; and
selectively etching the material of the protection layer to remove the protection layer from the at least one sidewall of the passivation, after forming the mask layer over the surface of the protection layer facing away from the wafer, and before etching the wafer.

14. The method according to claim 13, wherein selectively etching the material of the protection layer to remove the protection layer from the at least one sidewall of the passivation comprises a plasma etch process.

15. The method according to claim 14, wherein the plasma etch process is carried out at a temperature in the range from about 10° C. to about 150° C.

16. The method according to claim 13, wherein selectively etching the material of the protection layer to remove the protection layer from the at least one sidewall of the passivation comprises using a $CF_4/O_2$ process gas mixture.

17. The method according to claim 12, wherein forming the mask layer over at least the surface of the protection layer facing away from the wafer comprises forming the mask layer over the surface of the protection layer facing away from the wafer and at least one sidewall of the protection layer.

18. A method for processing a wafer, the method comprising:
forming a passivation over the wafer;
forming a protection layer over at least a surface of the passivation facing away from the wafer, wherein the protection layer comprises a material that is selectively etchable to a material of the passivation;
forming a mask layer over at least a surface of the protection layer facing away from the wafer, wherein the mask layer comprises a material that is selectively etchable to the material of the protection layer;
etching the wafer using the mask layer as a mask;
selectively etching the material of the mask layer to remove the mask layer from the protection layer, after etching the wafer; and
selectively etching the material of the protection layer to remove the protection layer from the passivation, after selectively etching the material of the mask layer, wherein the material of the passivation comprises an imide material, wherein the material of the protection layer comprises silicon nitride, and wherein the material of the mask layer comprises a photoresist.

19. A method for processing a wafer, the method comprising:
forming a passivation over the wafer;
forming a protection layer over at least a surface of the passivation facing away from the wafer, wherein the protection layer comprises a material that is selectively etchable to a material of the passivation;
forming a mask layer over at least a surface of the protection layer facing away from the wafer, wherein the mask layer comprises a material that is selectively etchable to the material of the protection layer;
etching the wafer using the mask layer as a mask;
selectively etching the material of the mask layer to remove the mask layer from the protection layer, after etching the wafer; and
selectively etching the material of the protection layer to remove the protection layer from the passivation, after selectively etching the material of the mask layer, wherein the material of the protection layer comprises a positive photoresist and the material of the mask layer comprises a negative photoresist, or vice versa.

* * * * *